United States Patent
Xu et al.

(10) Patent No.: US 9,020,066 B2
(45) Date of Patent: Apr. 28, 2015

(54) SINGLE-BIT DIRECT MODULATION TRANSMITTER

(71) Applicant: Innophase, Inc., Chicago, IL (US)

(72) Inventors: Yang Xu, Chicago, IL (US); Xuejun Zhang, Chicago, IL (US)

(73) Assignee: Innophase Inc., Chicago, IL (US)

(*) Notice: Subject to any disclaimer, the term of this patent is extended or adjusted under 35 U.S.C. 154(b) by 26 days.

(21) Appl. No.: 13/842,470

(22) Filed: Mar. 15, 2013

(65) Prior Publication Data
US 2014/0185708 A1    Jul. 3, 2014

Related U.S. Application Data

(60) Provisional application No. 61/615,169, filed on Mar. 23, 2012.

(51) Int. Cl.
*H04L 25/03* (2006.01)
*H04L 27/34* (2006.01)
*H03M 1/68* (2006.01)

(52) U.S. Cl.
CPC ...... *H04L 25/03834* (2013.01); *H04L 25/0384* (2013.01); *H04L 27/34* (2013.01); *H03M 1/685* (2013.01)

(58) Field of Classification Search
CPC .............. H04L 25/03834; H04L 27/2626; H94L 25/0384
USPC ............ 375/296, 308; 455/95, 101, 103, 110, 455/114.2, 114.3
See application file for complete search history.

(56) References Cited

U.S. PATENT DOCUMENTS

| | | | |
|---|---|---|---|
| 5,313,205 A | 5/1994 | Wilson | |
| 6,339,621 B1* | 1/2002 | Cojocaru et al. | 375/247 |
| 6,683,905 B1* | 1/2004 | King et al. | 375/141 |
| 7,606,321 B2* | 10/2009 | Pan | 375/295 |
| 8,233,563 B2* | 7/2012 | Wurm et al. | 375/296 |
| 2005/0240368 A1* | 10/2005 | Pan et al. | 702/106 |
| 2007/0035425 A1 | 2/2007 | Hinrichs et al. | |

(Continued)

OTHER PUBLICATIONS

Seddighrad et al., "A 3.6GHz, 16mW EΔ DAC for a 802.11n / 802.16e transmitter with 30dB digital power control in 90nm CMOS", Proc. IEEE European Solid-State Circuits Conf., 2008, pp. 202-205.*

(Continued)

*Primary Examiner* — Sophia Vlahos
(74) *Attorney, Agent, or Firm* — Invention Mine, LLC

(57) ABSTRACT

Single-bit transmitter modulator having a digital pulse shaping filter configured to shape data pulses of an inphase signal and quadrature signal; an upsampling filter configured to increase the sample rate of the inphase signal and quadrature signal; a sigma-delta modulator providing a one-bit inphase output signal and a one-bit quadrature output signal; an inphase low-order analog low pass filter coupling the one-bit inphase output signal to an inphase channel input of a quadrature modulator, and a quadrature low-order analog low pass filter coupling the one-bit quadrature output signal to a quadrature channel input of a quadrature modulator; and, wherein the quadrature modulator is connected to a carrier signal generator and is configured to generate an inphase and quadrature modulated carrier.

33 Claims, 6 Drawing Sheets

(56) References Cited

U.S. PATENT DOCUMENTS

| | | |
|---|---|---|
| 2007/0139239 A1 | 6/2007 | Keehr |
| 2007/0159259 A1* | 7/2007 | Suh et al. .......................... 331/2 |
| 2007/0268854 A1* | 11/2007 | Octaviano et al. ............ 370/328 |
| 2008/0159453 A1* | 7/2008 | Smith .......................... 375/350 |
| 2011/0109354 A1* | 5/2011 | Feng et al. ................... 327/156 |
| 2012/0236976 A1 | 9/2012 | Smith |

OTHER PUBLICATIONS

Wu, Xiaofeng, "One-Bit Processing for Wireless Networked Real-Time Control", Joint 48th IEEE Conference on Decision and Control and 28th Chinese Control Conference Shanghai, P.R. China, Dec. 15-18, 2009, pp. 2023-2027.

International Search Report for PCT/US2014/030510, dated Mar. 18, 2015, 3 pages.

\* cited by examiner

SINGLE-BIT DIRECT MODULATION TRANSMITTER

CLAIM FOR PRIORITY UNDER 35 USC 119(E)

Priority is hereby claimed to U.S. Provisional Patent Application Ser. No. 61/615,169, filed Mar. 23, 2012, entitled Receiver and Transmitter Architecture and Methods for Binary and Quadrature Phase Shift Keying Signals, the contents of which is hereby incorporated herein by reference.

CROSS REFERENCE TO RELATED APPLICATIONS

This application is related to the following co-pending applications, filed on even date herewith, all of which are incorporated herein by reference in their entirety: Ser. No. 13/840,478 filed Mar. 15, 2013, entitled POLAR RECEIVER SIGNAL PROCESSING AND ARCHITECTURE; Ser. No. 13/839,557, filed Mar. 15, 2013, entitled POLAR RECEIVER SIGNAL PROCESSING APPARATUS AND METHODS; Ser. No. 13/839,462 filed Mar. 15, 2013, entitled LNA WITH LINEARIZED GAIN OVER EXTENDED DYNAMIC RANGE; and, Ser. No. 13/840,379, filed Mar. 15, 2013, entitled DIGITALLY CONTROLLED INJECTION LOCKED OSCILLATOR.

BACKGROUND OF THE INVENTION

Recent advances in high speed integrated circuit technologies enable various innovative and versatile applications through ultra-low-power wireless link such as mesh sensor network, remote industrial monitoring and implantable medical devices. For the wireless data access, the modulation scheme adapted is affects the link qualities in terms of bit rate and bit error rate.

Phase shift keying (PSK), specifically the binary phase shift keying (BPSK) and quadrature phase shift keying (QPSK), is a widely used digital modulation scheme in wireless systems such as 802.11 (WiFi) and 802.15.4, global positioning system (GPS), as well as numerous other applications including medical telemetry, machine to machine (M2M) communications, and the like. This technique represents digital bits by shifting the phase of the carrier signals. Under similar bandwidth occupation, PSK signals are more robust to noise as compared to amplitude shift keying (ASK) or frequency shift keying (FSK).

In view of the expanding uses of mobile wireless and low power devices, there exists a need for simplified and lower power wireless data transmission circuits.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
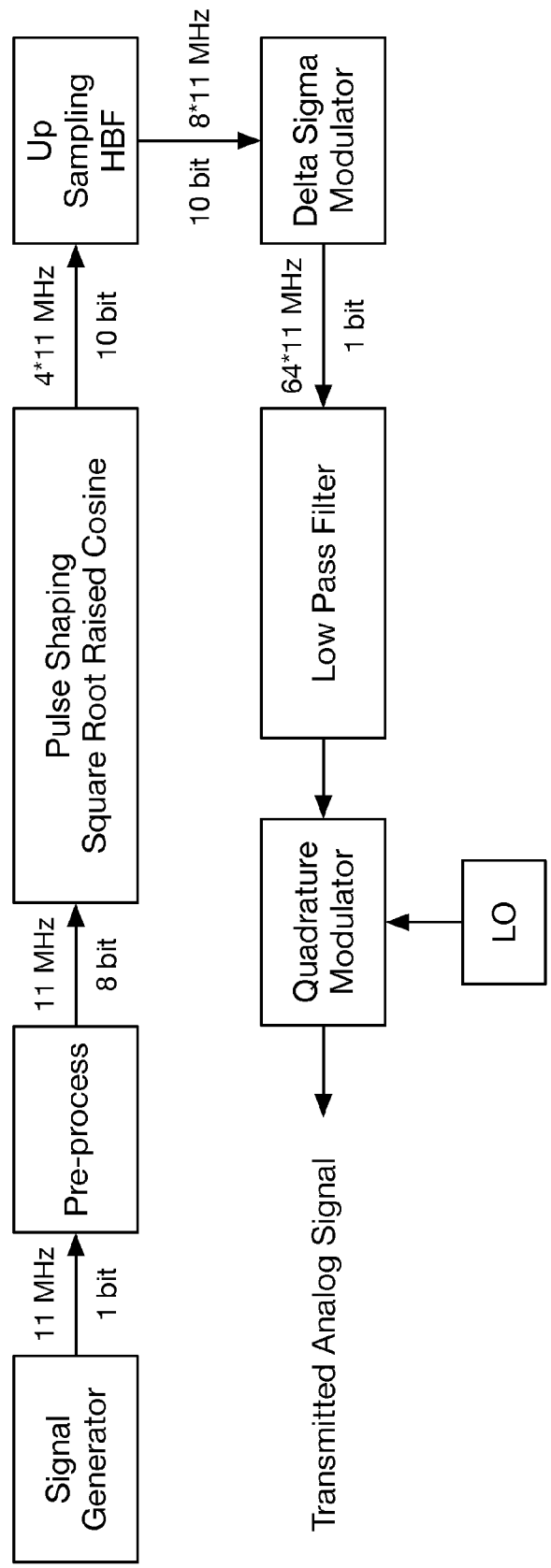
FIG. 1 is a block diagram of a single-bit transmitter in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

With reference to FIG. 1, a single-bit transmitter architecture will be described in accordance with some embodiments. The apparatus may include a signal generator such as a data source for transmission. The data rate may be 11 M bit/s. The bit sequence may be pre-processed to increase the sample rate to 11 MHz, with each sample represented as 8 data bits. The pre-processed data may be shaping in a digital pulse shaping filter configured to shape data pulses of an inphase signal and quadrature signal. The output of the shaping filter may be 44 MHz, and ten bits per sample. The shaped pulses may then be further upsampled through interpolation, or an up-sampling half band filter. The upsampling filter may be configured to increase the sample rate of the inphase signal and quadrature signal to 88 MHz sample rate at 10 bits per sample. The upsampled signals may then be applied to a sigma-delta modulator configured to provide a one-bit inphase output signal and a one-bit quadrature output signal. An inphase low-order analog low pass filter couples the one-bit inphase output signal to an inphase channel input of a quadrature modulator, and a quadrature low-order analog low pass filter couples the one-bit quadrature output signal to a quadrature channel input of a quadrature modulator. The quadrature modulator is connected to a carrier signal generator and is configured to generate an inphase and quadrature modulated carrier.

In an embodiment, each of the inphase low-order analog low pass filter and the quadrature low-order analog low pass filter are a first or second order RC or LC filter. In a further embodiment, each of the inphase low-order analog low pass filter and the quadrature low-order analog low pass filter are a third order RC or LC filter.

The apparatus may be designed such that the combined filtering of the digital pulse shaping filter and the inphase low-order analog low pass filter and the quadrature low-order analog low pass filter impart a power spectrum of the inphase and quadrature modulated carrier in conformance with 802.11.b.

In a further embodiment, the inphase low-order analog low pass filter and the quadrature low-order analog low pass filter are selectably configurable to provide a combined filtering effect when combined with the digital pulse shaping filter, and the selectable configuration provides a power spectrum of the inphase and quadrature modulated carrier in conformance with a selected one of a plurality of transmit power masks.

The plurality of transmit power masks may include two transmit power masks selected from the group comprising an 802.11.a power mask, an 802.11.b power mask, and an 802.11.g power mask. The apparatus may further comprising a transmit mode mask selector configured to configure the inphase low-order analog low pass filter and the quadrature low-order analog low pass filter.

In one embodiment, the digital pulse shaping filter is a root-raised cosine filter. In a further embodiment, the sigma-delta modulator bit rate is either 704 MHz or 352 MHz.

Figure 2:
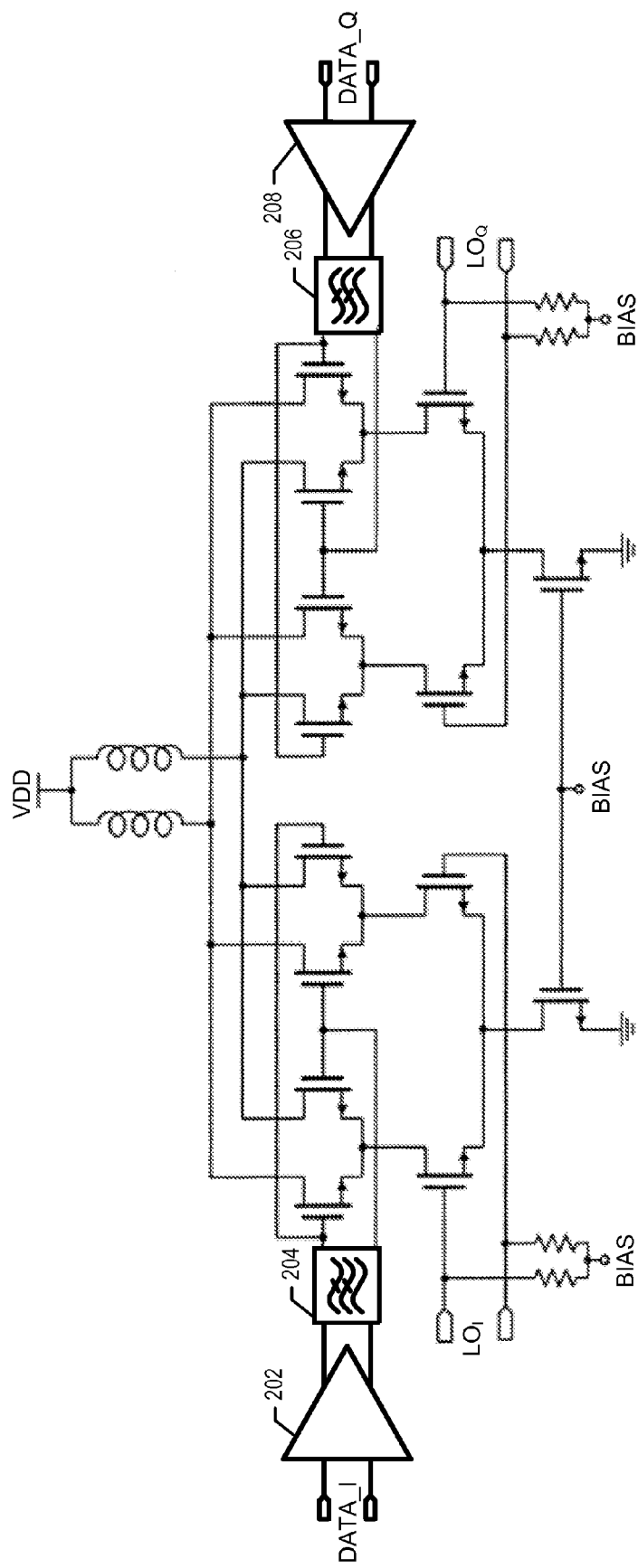
FIGS. 2 and 3 are circuit diagrams of embodiments of a single bit transmitter.
Figure 3:
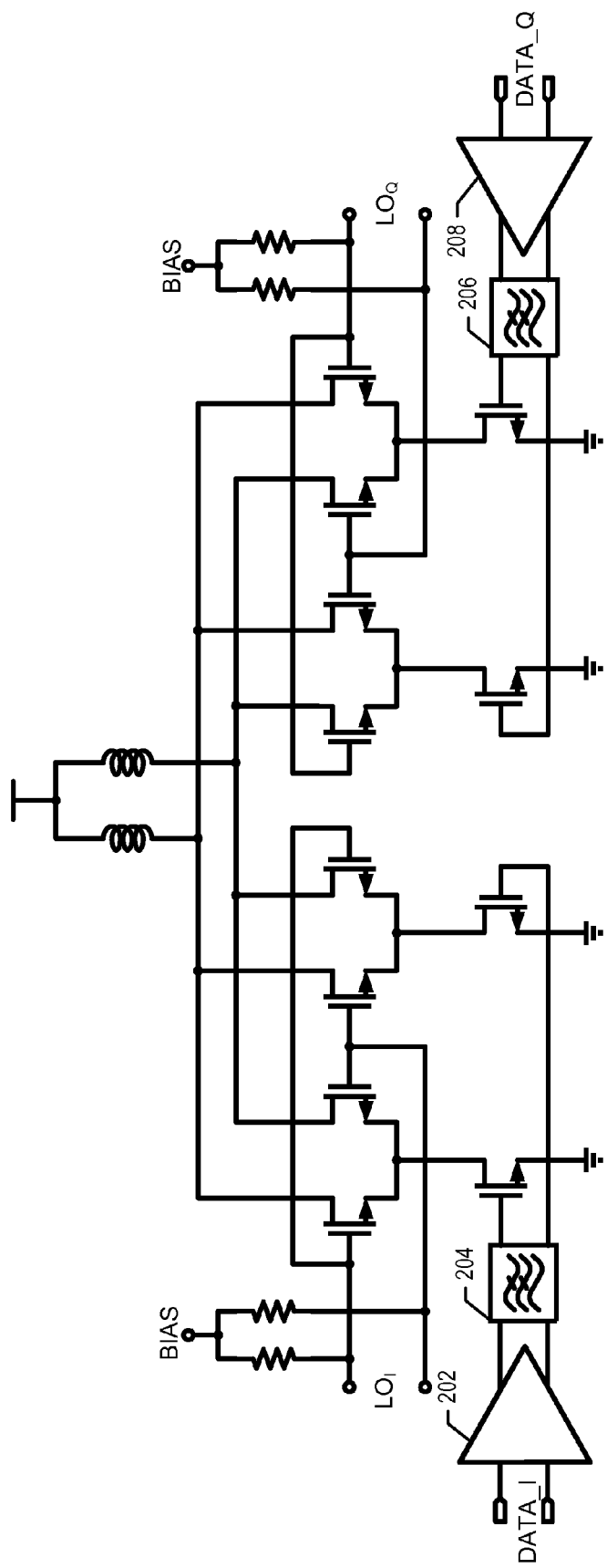
Figure 4:
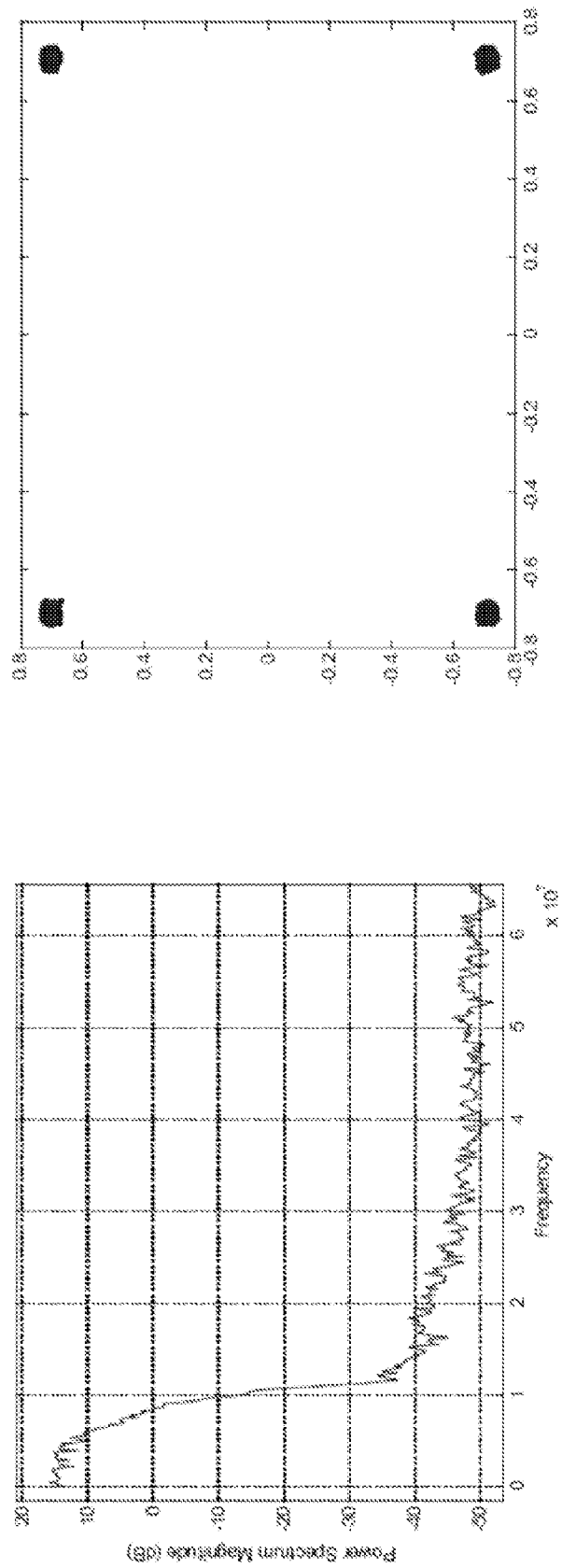
FIG. 4 is a signal plot of the transmitted signal spectrum and transmitted signal constellation in accordance with some embodiments.

With reference to FIGS. 2 and 3, different embodiments of the interconnection of the 1-bit inphase and quadrature outputs to the quadrature modulator via data buffers 202, 208 and the loworder low pass filters 204, 206 is shown. With respect to FIG. 4, signal plots of the transmit power spectrum and the corresponding signal constellation are shown.

Figure 5:
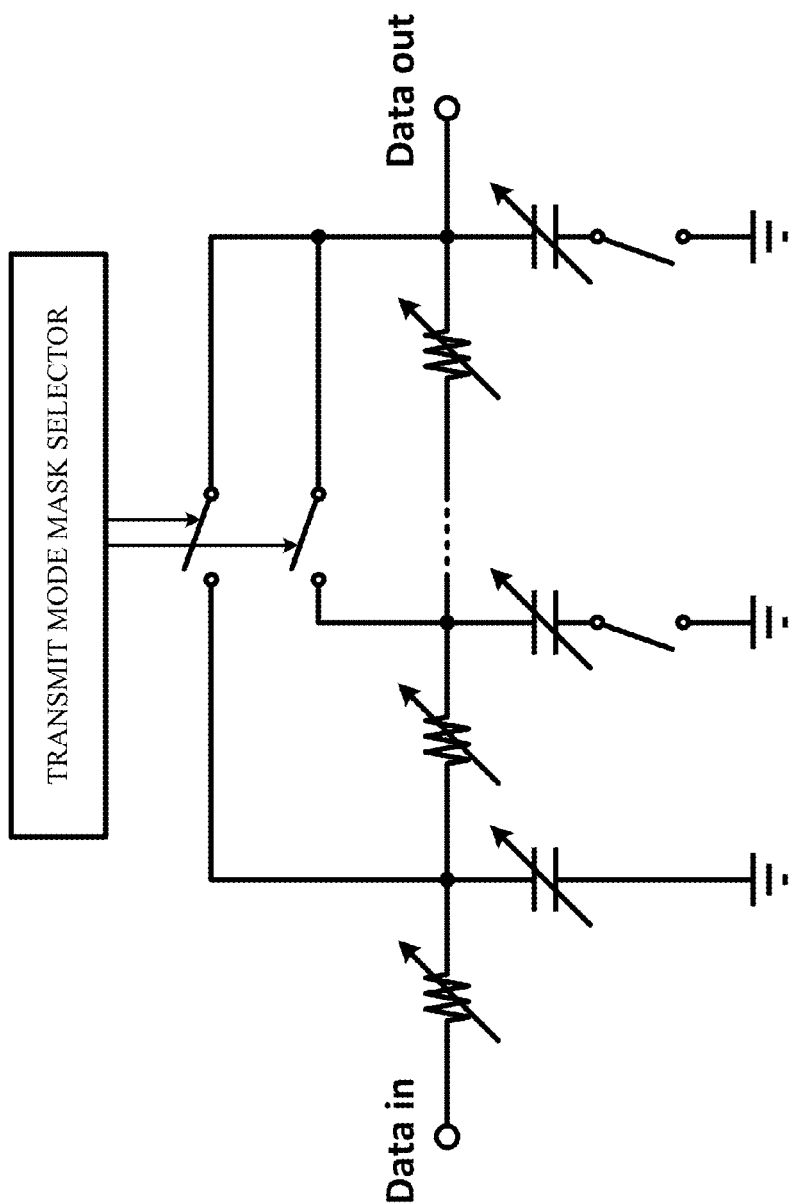
FIG. 5 is a circuit diagram of a configurable low pass filter in accordance with some embodiments.

With respect to FIG. 5, a configurable low pass filter is shown, under the control of the transmit mode mask selector. The low pass filter may take on four different low pass characteristics to configure the low pass filter and hence the transmit power mask to accommodate a selected transmit mask.

Figure 6:
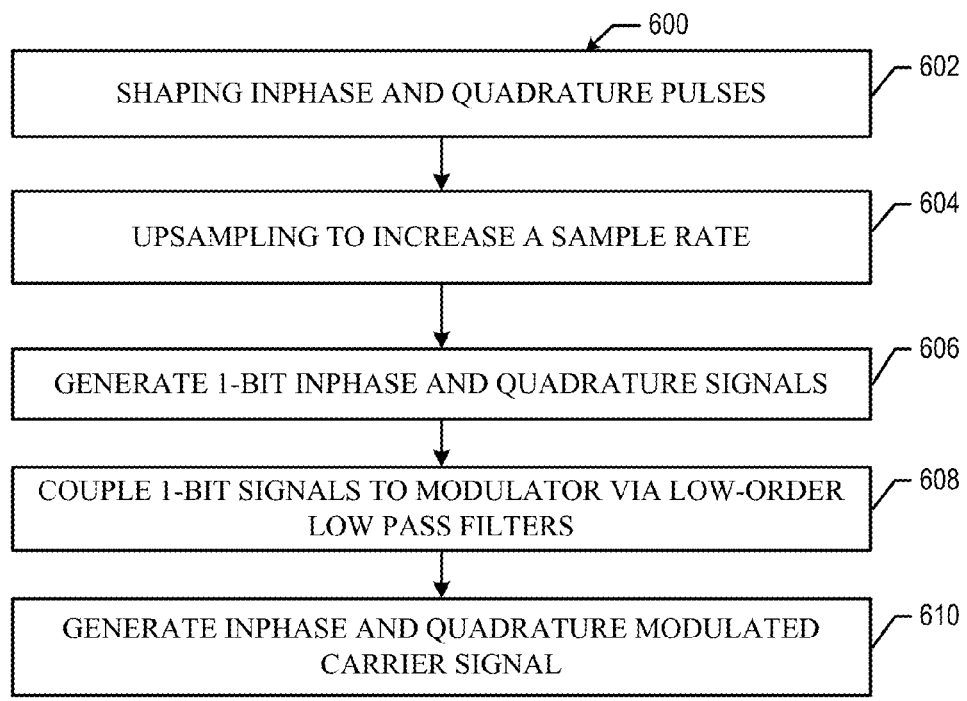
FIG. 6 is a flow chart of a method in accordance with some embodiments.

With respect to FIG. 6, a method 600 will be described in accordance with some embodiments. The method 600 may comprise shaping 602 discrete time data pulses of an inphase signal and quadrature signal; upsampling 604 to increase the sample rate of the inphase signal and quadrature signal; generating 606 a one-bit inphase output signal and a one-bit quadrature output signal using a sigma-delta digital-to-analog converter; coupling 608 the one-bit inphase output signal to an inphase channel input of a quadrature modulator using an inphase low-order analog low pass filter, and coupling the one-bit quadrature output signal to a quadrature channel input of a quadrature modulator using a quadrature low-order analog low pass filter; and, generating 610 an inphase and quadrature modulated carrier using the quadrature modulator. Each of the inphase low-order analog low pass filter and the quadrature low-order analog low pass filter may a first or second order RC or LC filters. The combined filtering of the digital pulse shaping filter and the inphase low-order analog low pass filter and the quadrature low-order analog low pass filter may be designed or configured to impart a power spectrum of the inphase and quadrature modulated carrier in conformance with 802.11.b. The method may further comprise: selecting the inphase low-order analog low pass filter from a plurality of low-order analog low pass filters; and, selecting the quadrature low-order analog low pass filter from a plurality of low-order analog low pass filters.

The inphase low-order analog low pass filter and the quadrature low-order analog low pass filter may be selected to provide a combined filtering effect when combined with the digital pulse shaping filter, and wherein the selected configuration provides a power spectrum of the inphase and quadrature modulated carrier in conformance with a selected one of a plurality of transmit power masks. The plurality of transmit power masks may include two or more transmit power masks selected from the group consisting of an 802.11.a power mask, an 802.11.b power mask, and an 802.11.g power mask.

The sigma-delta modulator bit rate is either 704 MHz or 352 MHz. In further embodiments, the method may further comprise: configuring the inphase low-order analog low pass filter and the quadrature low-order analog low pass filter with a transmit mode mask selector. Further, the method may further comprise generating a carrier signal using a mixer and two half-frequency injection locked oscillators.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus comprising:
 a digital pulse shaping filter configured to shape data pulses of an inphase signal and quadrature signal;
 an upsampling filter configured to increase the sample rate of the inphase signal and quadrature signal;
 a sigma-delta modulator providing a one-bit inphase output signal and a one-bit quadrature output signal;
 an inphase low-order analog low pass filter coupling the one-bit inphase output signal to an inphase channel input of a quadrature modulator; and
 a quadrature low-order analog low pass filter coupling the one-bit quadrature output signal to a quadrature channel input of the quadrature modulator,
 wherein the quadrature modulator is connected to a carrier signal generator and is configured to generate an inphase and quadrature modulated carrier,
 wherein the inphase low-order analog low pass filter and the quadrature low-order analog low pass filter are selectably configurable to provide a combined filtering effect when combined with the digital pulse shaping filter, and
 wherein the selectable configuration provides a power spectrum of the inphase and quadrature modulated carrier in conformance with a selected one of a plurality of transmit power masks.

2. The apparatus of claim 1 wherein each of the inphase low-order analog low pass filter and the quadrature low-order analog low pass filter are fourth order or less RC or LC filter.

3. The apparatus of claim 2 wherein the combined filtering of the digital pulse shaping filter and the inphase low-order analog low pass filter and the quadrature low-order analog low pass filter impart a power spectrum of the inphase and quadrature modulated carrier in conformance with the 802.11b standard.

4. The apparatus of claim 1 wherein the plurality of transmit power masks includes two transmit power masks selected from the group consisting of an 802.11a standard power mask, an 802.11b standard power mask, and an 802.11g standard power mask.

5. The apparatus of claim 1 wherein the digital pulse shaping filter is a root-raised cosine filter.

6. The apparatus of claim 1 wherein the sigma-delta modulator bit rate is either 704 MHz or 352 MHz.

7. The apparatus of claim 1 further comprising a transmit mode mask selector configured to configure the inphase low-order analog low pass filter and the quadrature low-order analog low pass filter.

8. The apparatus of claim 7 wherein the low pass filters include switchable resistors.

9. The apparatus of claim 1 wherein the carrier signal generator comprises a mixer and two half-frequency injection locked oscillators.

10. A method comprising:
 shaping discrete time data pulses of an inphase signal and quadrature signal;
 upsampling to increase the sample rate of the inphase signal and quadrature signal;
 generating a one-bit inphase output signal and a one-bit quadrature output signal using a sigma-delta modulator;
 coupling the one-bit inphase output signal to an inphase channel input of a quadrature modulator using an inphase low-order analog low pass filter;
 coupling the one-bit quadrature output signal to a quadrature channel input of a quadrature modulator using a quadrature low-order analog low pass filter;
 generating an inphase and quadrature modulated carrier using the quadrature modulator;
 selecting the inphase low-order analog low pass filter from a plurality of low-order analog low pass filters; and
 selecting the quadrature low-order analog low pass filter from a plurality of low-order analog low pass filters,
 wherein the inphase low-order analog low pass filter and the quadrature low-order analog low pass filter are selected to provide a combined filtering effect when combined with the digital pulse shaping filter, and
 wherein the selected configuration provides a power spectrum of the inphase and quadrature modulated carrier in conformance with a selected one of one of a plurality of transmit power masks.

11. The method of claim 10 wherein each of the inphase low-order analog low pass filter and the quadrature low-order analog low pass filter are a first or second order RC or LC filter.

12. The method of claim 11 wherein the combined filtering of the digital pulse shaping filter and the inphase low-order analog low pass filter and the quadrature low-order analog low pass filter impart a power spectrum of the inphase and quadrature modulated carrier in conformance with the 802.11b standard.

13. The method of claim 10 wherein the plurality of transmit power masks includes two transmit power masks selected from the group consisting of an 802.11a standard power mask, an 802.11b standard power mask, and an 802.11g standard power mask.

14. The method of claim 10 wherein the sigma-delta digital-to-analog converter bit rate is either 704 MHz or 352 MHz.

15. The method of claim 10 further comprising:
configuring the inphase low-order analog low pass filter and the quadrature low-order analog low pass filter with a transmit mode mask selector.

16. The method of claim 10 further comprising generating a carrier signal using a mixer and two half-frequency injection locked oscillators.

17. An apparatus comprising:
a digital pulse shaping filter configured to shape data pulses of an inphase signal and quadrature signal;
an upsampling filter configured to increase the sample rate of the inphase signal and quadrature signal;
a sigma-delta modulator providing a one-bit inphase output signal and a one-bit quadrature output signal;
an inphase low-order analog low pass filter coupling the one-bit inphase output signal to an inphase channel input of a quadrature modulator;
a quadrature low-order analog low pass filter coupling the one-bit quadrature output signal to a quadrature channel input of the quadrature modulator; and
a transmit mode mask selector configured to configure the inphase low-order analog low pass filter and the quadrature low-order analog low pass filter,
wherein the quadrature modulator is connected to a carrier signal generator and is configured to generate an inphase and quadrature modulated carrier.

18. The apparatus of claim 17 wherein each of the inphase low-order analog low pass filter and the quadrature low-order analog low pass filter are fourth order or less RC or LC filter.

19. The apparatus of claim 18 wherein the combined filtering of the digital pulse shaping filter and the inphase low-order analog low pass filter and the quadrature low-order analog low pass filter impart a power spectrum of the inphase and quadrature modulated carrier in conformance with the 802.11b standard.

20. The apparatus of claim 17 wherein the inphase low-order analog low pass filter and the quadrature low-order analog low pass filter are selectably configurable to provide a combined filtering effect when combined with the digital pulse shaping filter, and wherein the selectable configuration provides a power spectrum of the inphase and quadrature modulated carrier in conformance with a selected one of a plurality of transmit power masks.

21. The apparatus of claim 20 wherein the plurality of transmit power masks includes two transmit power masks selected from the group consisting of an 802.11a standard power mask, an 802.11b standard power mask, and an 802.11g standard power mask.

22. The apparatus of claim 17 wherein the digital pulse shaping filter is a root-raised cosine filter.

23. The apparatus of claim 17 wherein the sigma-delta modulator bit rate is either 704 MHz or 352 MHz.

24. The apparatus of claim 17 wherein the low pass filters include switchable resistors.

25. The apparatus of claim 17 wherein the carrier signal generator comprises a mixer and two half-frequency injection locked oscillators.

26. A method comprising:
shaping discrete time data pulses of an inphase signal and quadrature signal;
upsampling to increase the sample rate of the inphase signal and quadrature signal;
generating a one-bit inphase output signal and a one-bit quadrature output signal using a sigma-delta modulator;
coupling the one-bit inphase output signal to an inphase channel input of a quadrature modulator using an inphase low-order analog low pass filter;
coupling the one-bit quadrature output signal to a quadrature channel input of a quadrature modulator using a quadrature low-order analog low pass filter;
generating an inphase and quadrature modulated carrier using the quadrature modulator; and
configuring the inphase low-order analog low pass filter and the quadrature low-order analog low pass filter with a transmit mode mask selector.

27. The method of claim 26 wherein each of the inphase low-order analog low pass filter and the quadrature low-order analog low pass filter are a first or second order RC or LC filter.

28. The method of claim 27 wherein the combined filtering of the digital pulse shaping filter and the inphase low-order analog low pass filter and the quadrature low-order analog low pass filter impart a power spectrum of the inphase and quadrature modulated carrier in conformance with the 802.11b standard.

29. The method of claim 26 further comprising:
selecting the inphase low-order analog low pass filter from a plurality of low-order analog low pass filters; and
selecting the quadrature low-order analog low pass filter from a plurality of low-order analog low pass filters.

30. The method of claim 29 wherein the inphase low-order analog low pass filter and the quadrature low-order analog low pass filter are selected to provide a combined filtering effect when combined with the digital pulse shaping filter, and wherein the selected configuration provides a power spectrum of the inphase and quadrature modulated carrier in conformance with a selected one of one of a plurality of transmit power masks.

31. The method of claim 26 wherein the plurality of transmit power masks includes two transmit power masks selected from the group consisting of an 802.11a standard power mask, an 802.11b standard power mask, and an 802.11g standard power mask.

32. The method of claim 26 wherein the sigma-delta digital-to-analog converter bit rate is either 704 MHz or 352 MHz.

33. The method of claim 26 further comprising generating a carrier signal using a mixer and two half-frequency injection locked oscillators.

* * * * *